(12) United States Patent
Eckert et al.

(10) Patent No.: US 8,974,900 B2
(45) Date of Patent: Mar. 10, 2015

(54) TRANSPARENT CONDUCTIVE FILM WITH HARDCOAT LAYER

(75) Inventors: Karissa L. Eckert, Blaine, MN (US); Matthew T. Stebbins, Woodbury, MN (US)

(73) Assignee: Carestream Health, Inc., Rochester, NY (US)

(*) Notice: Subject to any disclaimer, the term of this patent is extended or adjusted under 35 U.S.C. 154(b) by 447 days.

(21) Appl. No.: 13/450,542

(22) Filed: Apr. 19, 2012

(65) Prior Publication Data

US 2012/0301733 A1 Nov. 29, 2012

Related U.S. Application Data

(60) Provisional application No. 61/488,815, filed on May 23, 2011.

(51) Int. Cl.
| | |
|---|---|
| *C09D 5/24* | (2006.01) |
| *C09D 167/06* | (2006.01) |
| *C09D 101/08* | (2006.01) |
| *C09D 101/10* | (2006.01) |
| *C09D 101/12* | (2006.01) |
| *C09D 101/14* | (2006.01) |
| *C08K 7/02* | (2006.01) |
| *C08K 7/06* | (2006.01) |
| *C08K 7/08* | (2006.01) |
| *H01B 1/20* | (2006.01) |
| *H01B 1/22* | (2006.01) |
| *H01L 31/18* | (2006.01) |
| *H01L 31/0224* | (2006.01) |
| *H01L 31/0392* | (2006.01) |
| *C09D 133/08* | (2006.01) |
| *C09D 133/10* | (2006.01) |
| *C09D 133/12* | (2006.01) |
| *H01L 51/44* | (2006.01) |

(52) U.S. Cl.
CPC ........... *H01L 31/1884* (2013.01); *H01L 51/442* (2013.01); *H01B 1/22* (2013.01); *H01L 31/022466* (2013.01); *H01L 31/0392* (2013.01); *Y02E 10/50* (2013.01); *C09D 101/14* (2013.01); *Y10S 428/918* (2013.01); *Y10S 977/762* (2013.01)
USPC ........... 428/328; 428/402; 428/480; 428/481; 428/483; 428/918; 428/292.1; 977/762

(58) Field of Classification Search
None
See application file for complete search history.

(56) References Cited

U.S. PATENT DOCUMENTS

| | | | | |
|---|---|---|---|---|
| 3,988,229 A | * | 10/1976 | Pacifici et al. | 522/78 |
| 4,539,349 A | * | 9/1985 | Blount et al. | 523/509 |
| 4,654,233 A | * | 3/1987 | Grant et al. | 427/379 |
| 7,144,689 B2 | * | 12/2006 | Ludemann et al. | 430/350 |
| 7,153,636 B1 | * | 12/2006 | Ludemann et al. | 430/353 |
| 7,339,793 B2 | | 3/2008 | Foster, Sr. et al. | |
| 7,956,287 B2 | * | 6/2011 | Takayama et al. | 174/94 R |
| 8,018,563 B2 | * | 9/2011 | Jones et al. | 349/139 |
| 8,018,568 B2 | * | 9/2011 | Allemand et al. | 349/187 |
| 8,049,333 B2 | * | 11/2011 | Alden et al. | 257/741 |
| 8,198,348 B2 | * | 6/2012 | Wu et al. | 523/500 |
| 2007/0074316 A1 | * | 3/2007 | Alden et al. | 977/762 |
| 2009/0068377 A1 | * | 3/2009 | Kuki | 428/1.1 |
| 2009/0274902 A1 | * | 11/2009 | Kume | 428/336 |
| 2010/0040840 A1 | * | 2/2010 | Saito et al. | 428/195.1 |
| 2010/0107600 A1 | * | 5/2010 | Hillel et al. | 60/235 |
| 2010/0307792 A1 | * | 12/2010 | Allemand et al. | 174/126.1 |
| 2012/0107598 A1 | * | 5/2012 | Zou et al. | 428/292.1 |
| 2012/0301737 A1 | * | 11/2012 | Labelle et al. | 428/481 |
| 2013/0341071 A1 | * | 12/2013 | Stebbins | 174/253 |

FOREIGN PATENT DOCUMENTS

| | | | |
|---|---|---|---|
| EP | 1947701 A2 | | 7/2008 |
| JP | 2009-234059 | * | 10/2009 |
| WO | WO 2007/022226 | * | 2/2007 |
| WO | WO2010/129604 | | 11/2010 |
| WO | WO2011/008226 | | 1/2011 |

OTHER PUBLICATIONS

International Search Report, International Application No. PCT/2012/034340, Aug. 29, 2012, 2 pages.
Joseph V. Koleske, "A Radiation-Cure Primer," Journal of Coatings Technology, vol. 69, No. 866, Mar. 1997, pp. 29-38.

* cited by examiner

*Primary Examiner* — Vivian Chen
(74) *Attorney, Agent, or Firm* — Reed L. Christiansen

(57) ABSTRACT

Disclosed is a transparent conductive film that comprises at least one carrier layer disposed on the opposite side of a transparent support from at least one conductive layer, and at least one hardcoat layer disposed on the at least one carrier layer. Such films, which exhibit superior hardness, adhesion, and curl, are useful for electronics applications.

9 Claims, No Drawings

TRANSPARENT CONDUCTIVE FILM WITH HARDCOAT LAYER

CROSS REFERENCE TO RELATED APPLICATIONS

This application claims the benefit of U.S. provisional application No. 61/488,815, filed May 23, 2011, entitled TRANSPARENT CONDUCTIVE FILM WITH HARDCOAT LAYERS, which is hereby incorporated by reference in its entirety.

SUMMARY

At least a first embodiment provides transparent conductive films comprising at least one transparent substrate comprising a first surface and a second surface disposed on opposite sides of the substrate, said substrate comprising at least one thermoplastic polymer; at least one conductive coating disposed on the first surface, the at least one conductive coating comprising at least one metal nanowire; at least one carrier layer disposed on the second surface, the at least one carrier layer comprising at least one first polyester resin and at least one first cellulose ester polymer; and at least one hardcoat layer disposed on the at least one carrier layer, the at least one hardcoat layer comprising at least one radiation curable monomer and at least one second cellulose ester polymer.

In some cases, the at least one transparent substrate comprises at least one second polyester resin, such as, for polyethylene terephthalate or a copolyester comprising ethylene terephthalate repeat units.

In some embodiments, the at least one metal nanowire comprises at least one coinage metal or at least one element from IUPAC Group 11 or silver.

In some cases, the at least one first polyester resin comprises an average of at least one unsaturated carbon-carbon bond for every ten of its repeat units.

In some embodiments the at least one first cellulose ester polymer, the at least one second cellulose ester polymer, or both, comprises cellulose acetate butyrate.

In some cases, the at least one radiation curable monomer comprises an average functionality of four or larger.

In such films, the least one hardcoat layer may have a pencil hardness of least about 6H or an adhesion value of about 5.0.

In such films, the total of the haze values of the at least one transparent substrate, the at least one carrier layer, and the at least one hardcoat layer may be less than about 0.60 percent.

At least a second embodiment provides transparent conductive films comprising at least one transparent substrate comprising a first surface and a second surface; at least one conductive coating disposed on the first surface, where the at least one conductive coating comprises at least one metal nanoparticle; at least one carrier layer disposed on the second surface, where the at least one carrier layer comprises at least one first polyester resin and at least one first cellulosic polymer; and at least one hardcoat layer disposed on the at least one carrier layer, with the at least one hardcoat layer comprising at least on radiation curable monomer and at least one second cellulosic polymer.

In at least some embodiments, the at least one transparent substrate may comprise at least one thermoplastic polymer, or at least one second polyester resin, such as, for example, polyethylene terephthalate or a copolyester comprising ethylene terephthalate repeat units. In at least some embodiments, the first surface and the second surface are on opposite sides of the at least one transparent substrate.

The at least one metal nanoparticle may, for example, comprise at least one nanowire, nanocube, nanorod, nanopyramid, nanotube, or the like. It may, for example, comprise at least one coinage metal, or at least one element form IUPAC Group 11, such as, for example, at least one silver nanowire.

The at least one first polyester resin may, for example, comprises an average of at least one unsaturated carbon-carbon bond for every ten of its repeat units. In at least some embodiments, the at least one first polyester resin has a weight average molecular weight between about 30,000 g/mol and about 70,000 g/mol.

In at least some embodiments, the at least one first cellulosic polymer may comprise a cellulose ester or a cellulose ether, or a cellulose ester, such as, for example, cellulose acetate butyrate. Such a cellulose acetate butyrate may, for example, have a weight average molecular weight of at least about 50,000 g/mol.

In at least some embodiments, the at least one radiation curable monomer comprises an average functionality of four or larger, or a majority of the at least one radiation curable monomer has a functionality of four or larger. In at least some embodiments, such a radiation curable monomer may comprise an acrylic monomer, such as, for example, an aliphatic urethane hexaacrylate, or an acrylic monomer with hydroxyl functionality, such as, for example, dipentaerythritolpentaacrylate.

In at least some embodiments, the at least one second cellulosic polymer may comprise a cellulose ester or a cellulose ether, or a cellulose ester, such as, for example, cellulose acetate butyrate. Such a cellulose acetate butyrate may, for example, have a weight average molecular weight of at least about 50,000 g/mol.

The at least one hardcoat layer may, for example, have a pencil hardness of at least about 6H, or an adhesion value of 5.0, or a flatness value of less than about 1.5 cm.

The total of the haze values of the at least one transparent substrate, the at least one carrier layer, and the at least one hardcoat layer may be, for example, less than about 0.60 percent.

Other embodiments provide devices comprising such transparent conductive films. Such devices may, for example, comprise touch screens, EMI shielding, electrochromic devices, LED lighting, photovoltaic solar panels, and the like.

These embodiments and other variations and modifications may be better understood from the description, exemplary embodiments, examples, and claims that follow.

DESCRIPTION

All publications, patents, and patent documents referred to in this document are incorporated by reference herein in their entirety, as though individually incorporated by reference.

U.S. provisional application No. 61/488,815, filed May 23, 2011, entitled TRANSPARENT CONDUCTIVE FILM WITH HARDCOAT LAYERS, is hereby incorporated by reference in its entirety.

Metal nanowire based transparent conductive films have attracted great attention recently due to their excellent electric conductivity, high light transmittance, and ease of manufacturing on a flexible substrate. The transparent conductive film prepared through the networking of silver nanowires has the potential to replace indium tin oxide as a transparent conductor in many applications, such as touch screens, EMI shielding, electrochromic devices, LED lighting, photovoltaic solar panels, and the like. Transparent conductive film prepared from silver nanowires in organic binders may produce materials with electric resistivity of, for example, less than 20 ohm/sq, with total light transmittance of, for example, 86% or higher, when coated on a flexible plastic substrate, such as, for example, a polyethylene terephthalate support.

Applicants have developed a superior transparent conductive film that comprises at least one carrier layer disposed on the opposite side of a transparent support from at least one conductive layer, and at least one hardcoat layer disposed on the at least one carrier layer. This film exhibits a hardcoat pencil hardness of at least about 6H, a haze value below about 0.60 percent exclusive of the at least one conductive layer, a hardcoat adhesion value of 5.0, and curl less than about 1.5 cm. This film is an improvement over other radiation cured hardcoat systems that may exhibit pencil hardnesses of up to about 4H, but that also exhibit poor adhesion and curl values.

In at least some embodiments, the at least one carrier layer comprises at least one polyester resin. Polyester resins may comprise, for example, aliphatic polyesters, aromatic polyesters, aliphatic copolyesters, aromatic copolyesters, or copolyesters having a combination of aliphatic and aromatic repeat units. Exemplary polyester resins are polyethylene terephthalate, polyethylene naphthalate, polybutylene terephthalate, poly($\epsilon$-caprolactone), poly(glycolide), poly(lactide), poly(lactide-co-glycolide), and the like. Some polyester resins may possess some extent of unsaturation, with double or triple carbon-carbon bonds being included for polymerization or crosslinking by thermal or radiation curing. For example, in some cases, a polyester resin may comprise an average of at least one unsaturated carbon-carbon bond, or at least two unsaturated carbon-carbon bonds, or at least three unsaturated carbon-carbon bonds, or at least four unsaturated carbon-carbon bonds, or at least five unsaturated carbon-carbon bonds, or at least six unsaturated carbon-carbon bonds, or at least seven unsaturated carbon-carbon bonds, or at least eight unsaturated carbon-carbon bonds, or at least nine unsaturated carbon-carbon bonds, or at least ten unsaturated carbon-carbon bonds, for every ten of its repeat units. Other polyester resins may be substantially unsaturated, and may, for example, comprise fewer than one unsaturated carbon-carbon bond for every ten or more of its repeat units.

In at least some embodiments, the at least one carrier layer comprises at least one cellulosic polymer, or the at least one hardcoat layer comprises at least one cellulosic polymer, or both the at least one carrier layer and the at least one hardcoat layer each comprise at least one cellulosic polymer. Cellulosic polymers are polysaccharides or derivatives of polysaccharides, that may have degrees of polymerization of, for example, 100, 1000, 10,000, or more. These include derivatives of cellulose, such as, for example, esters and ethers of cellulose. Cellulosic ester polymers (also referred to as "cellulose esters") include cellulose acetates, such as, for example, cellulose acetate, cellulose triacetate, cellulose propionate, cellulose acetate propionate, cellulose acetate butyrate (CAB), and the like. Cellulosic ether polymers (also referred to as "cellulose ethers") include, for example, methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose, and the like. These and other such cellulosic polymers will be understood by those skilled in the art.

UV curable hardcoats are known. See, for example, Koleske, J. V., Coatings Technology, 1997, 69(866), 29; U.S. Pat. No. 7,339,793; and US patent application publication 2009/0274902; each of which is hereby incorporated by reference in its entirety. UV curable hardcoats may, for example, comprise monomeric or functional acrylates. Monomeric and functional acrylates can have molecular weights of 10,000 g/mol or less, typically 5,000 g/mol or less. UV curable hardcoats may, for example, comprise unsaturated polyesters. Unsaturated polyesters can attain high molecular weights and high crosslink densities upon exposure to ultraviolet radiation, which can result in improved coating durability.

In at least some embodiments, the at least one hardcoat comprises at least one radiation curable monomer. Radiation curable monomers are known. These may, for example, comprise monomers with one or more acrylic or methacrylic groups, such as, for example, polyfunctional monomers with two, three, four, five, six, or more polymerizable groups. At least some unsaturated polyesters or their oligomers may be radiation curable monomers. In some cases, radiation curable monomers may be polymerized or crosslinked in the presence of light, such as, for example, ultraviolet light at wavelengths of, for example, about 246 nm or about 280 nm. Dipentaerythritol pentaacrylate (DPPA) is an exemplary radiation curable monomer. This and other such monomers will be understood by those skilled in the art.

Curing may be aided through use of photoinitiators, such as, for example, 1-hydroxycyclohexylphenyl ketone. This and other such photoinitiators will be understood by those skilled in the art.

EXEMPLARY EMBODIMENTS

U.S. provisional application No. 61/488,815, filed May 23, 2011, entitled TRANSPARENT CONDUCTIVE FILM WITH HARDCOAT LAYERS, which is hereby incorporated by reference in its entirety, disclosed the following 25 non-limiting exemplary embodiments:

A. A transparent conductive film comprising:
  at least one transparent substrate comprising a first surface and a second surface;
  at least one conductive coating disposed on the first surface, the at least one conductive coating comprising at least one metal nanoparticle;
  at least one carrier layer disposed on the second surface, the at least one carrier layer comprising at least one first polyester resin and at least one first cellulosic polymer; and
  at least one hardcoat layer disposed on the at least one carrier layer, the at least one hardcoat layer comprising at least one radiation curable monomer and at least one second cellulosic polymer.

B. The transparent conductive film according to embodiment A, wherein the at least one transparent substrate comprises at least one thermoplastic polymer.

C. The transparent conductive film according to embodiment A, wherein the at least one transparent substrate comprises at least one second polyester resin.

D. The transparent conductive film according to embodiment A, wherein the at least one transparent substrate comprises polyethylene terephthalate or a copolyester comprising ethylene terephthalate repeat units.

E. The transparent conductive film according to embodiment A, wherein the first surface and the second surface are on opposite sides of the at least one transparent substrate.

F. The transparent conductive film according to embodiment A, wherein the at least one metal nanoparticle comprises at least one nanowire, nanocube, nanorod, nanopyramid, or nanotube.

G. The transparent conductive film according to embodiment A, wherein the at least one metal nanoparticle comprises at least one coinage metal or at least one element from IUPAC Group 11.

H. The transparent conductive film according to embodiment A, wherein the at least one metal nanoparticle comprises at least one silver nanowire.

J. The transparent conductive film according to embodiment A, further wherein the at least one first polyester resin comprises an average of at least one unsaturated carbon-carbon bond for every ten of its repeat units.

K. The transparent conductive film according to embodiment A, wherein the at least one first polyester resin has a weight average molecular weight between about 30,000 g/mol and about 70,000 g/mol.

L. The transparent conductive film according to embodiment A, wherein the at least one first cellulosic polymer comprises a cellulose ester or a cellulose ether.

M. The transparent conductive film according to embodiment A, wherein the at least one first cellulosic polymer comprises a cellulose ester.

N. The transparent conductive film according to embodiment A, wherein the at least one first cellulosic polymer comprises cellulose acetate butyrate.

P. The transparent conductive film according to embodiment A, wherein the at least one first cellulosic polymer comprises cellulose acetate butyrate having weight average molecular weight greater than about 50,000 g/mol.

Q. The transparent conductive film according to embodiment A, wherein the at least one radiation curable monomer comprises an average functionality of four or larger.

R. The transparent conductive film according to embodiment A, wherein a majority of the at least one radiation curable monomer has a functionality of four or larger.

S. The transparent conductive film according to embodiment A, wherein the at least one second cellulosic polymer comprises a cellulose ester or a cellulose ether.

T. The transparent conductive film according to embodiment A, wherein the at least one second cellulosic polymer comprises a cellulose ester.

U. The transparent conductive film according to embodiment A, wherein the at least one second cellulosic polymer comprises cellulose acetate butyrate.

V. The transparent conductive film according to embodiment A, wherein the at least one second cellulosic polymer comprises cellulose acetate butyrate having weight average molecular weight of at least about 50,000 g/mol.

W. The transparent conductive film according to embodiment A, wherein the at least one hardcoat layer has a pencil hardness of least about 6H.

X. The transparent conductive film according to embodiment A, wherein the at least one hardcoat layer has an adhesion value of 5.0.

Y. The transparent conductive film according to embodiment A having a flatness value less than about 1.5 cm.

Z. The transparent conductive film according to embodiment A, wherein the total of the haze values of the at least one transparent substrate, the at least one carrier layer, and the at least one hardcoat layer is less than about 0.60 percent.

AA. A device comprising the transparent conductive film according to embodiment A.

EXAMPLES

Materials

Unless otherwise noted, materials were available from Sigma-Aldrich, Milwaukee, Wis.

CAB381-20 is a cellulose acetate butyrate polymer (Eastman Chemical).

VITEL® PE2700LMW is a linear unsaturated polyester resin having a weight average molecular weight of 30,000-70,000 g/mol. (Bostik).

SARTOMER® CN968 is an aliphatic urethane hexaacrylate oligomer (Sartomer Industries).

SARTOMER® SR399 is a dipentaerythritolpentaacrylate monomer (Sartomer Industries).

X-CURE 184 is a 1-hydroxycyclohexylphenone photoinitiator. (Dalian).

Example 1

Composition A was prepared by combining and mixing at room temperature 2.78 g of CAB381-20 cellulose acetate butyrate, 1.85 g of VITEL® PE2700LMW polyester resin, and 195.36 g of methyl ethyl ketone (MEK).

Composition A was coated on a 7 mil clear polyethylene terephthalate support using a #6 Mayer rod. The coated film was dried at 99° C. for 3 minutes to produce a carrier layer coated film.

Example 2

Composition B was prepared by combining and mixing at room temperature 9.51 g of X-CURE 184 photoinitator, 3.17 g of benzophenone, and 37.31 g of MEK.

Composition C was prepared by combining and mixing at room temperature 20.0 g of CAB381-20 cellulose acetate butyrate and 180.0 g of MEK.

Composition D was prepared by combining 6.92 g of Composition C, 9.02 g of MEK, 2.60 g of SARTOMER® CN968, and 7.79 g of SARTOMER® SR399, and mixing for 15 min. 3.68 g of Composition B was then added to the mixture, which was allowed to mix for an additional 15 min.

Composition D was then coated over the carrier layer of the coated film of Example 1, to form a hardcoat coating layer, using a #8 Mayer rod. The coated film was dried at 99° C. for 5 min. The dried film was then conveyed under a 600 W ultraviolet bulb at a speed of 15 m/min to obtain a transparent film.

Adhesion of the hardcoat layer side of the transparent film was evaluated according to ASTM 3359 Standard Test Method for Measuring Adhesion by Tape. A cross-hatched area was scribed on the coating with a razor blade and gently removing the debris with a lint-free cotton pad. Adhesive tape (#610 semi-transparent pressure-sensitive tape from 3M Company, St. Paul, Minn.) was then applied to the cross-hatched area and smoothed with a rubber roller until there were no air bubbles between the tape and the coated film. The tape was then rapidly peeled off. The appearance of the coated film was given a score on a 0 to 5 scale: 5=edges of scribed cuts completely smooth; 4=flakes of coating detached at some intersections of scribed lines, with less than about 5% of the test area being affected; 3=flakes of coating detached along some edges and at some intersections of scribed lines, with about 5 to 15% of the test area being affected; 2=flakes of coating detached along some edges of scribed lines and on parts of the squares, with about 15 to 35% of the test area being affected; 1=coating detached along the edges of scribed lines in large ribbons, with more than about 35% of the test area being affected; 0=coating completely removed. The hardcoat layer exhibited an adhesion value of 5.0.

Pencil hardness of the coating was measured according to ASTM 3363 Standard Test Method for Film Hardness by Pencil. The method reports the hardest standard pencil lead that does not mar the coating when pushing a pencil away from the operator and where the pencil is oriented at a 45° angle away from the operator. The hardcoat layer achieved a pencil hardness score of 6H.

A 30 cm×30 cm portion of the coated film was evaluated for curl. The substrate was placed on a horizontal surface and heated to 149° C. for 5 min. It was then allowed to cool to ambient temperature. The deflections of the four corners of the substrate from the horizontal surface were measured, with the largest value being recorded. The curl for this coating was 1.4 cm.

Haze was measured using a BYK Gardner Hazegard instrument, according to ASTM method D-1003. The haze for the coated film was 0.53%.

Example 3

Comparative

The procedure of Example 2 was repeated, but without using the carrier layer of Example 1. Instead, the hardcoat coating Composition D was coated directly onto the polyethylene terephthalate substrate. The resulting coating film was evaluated for adhesion, pencil hardness, curl, and haze, with the results being summarized in Table I, along with the superior results of the coated film of Example 2.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

TABLE I

| Sample | Pencil Hardness | Curl (cm) | Adhesion | Percent Haze |
| --- | --- | --- | --- | --- |
| Example 2 | 6H | 1.4 | 5.0 | 0.53 |
| Example 3 | 5H | 1.9 | 2.0 | 0.60 |

What is claimed:

1. A transparent conductive film comprising:
    at least one transparent substrate comprising a first surface and a second surface disposed on opposite sides of the substrate, said substrate comprising at least one thermoplastic polymer;
    at least one conductive coating disposed on the first surface, the at least one conductive coating comprising at least one metal nanowire;
    at least one carrier layer disposed on the second surface, the at least one carrier layer comprising at least one first polyester resin and at least one first cellulose ester polymer; and
    at least one hardcoat layer disposed on the at least one carrier layer, the at least one hardcoat layer comprising at least one radiation curable monomer and at least one second cellulose ester polymer,
    wherein the at least one first polyester resin comprises an average of at least one unsaturated carbon-carbon bond for every ten of its repeat units.

2. The transparent conductive film according to claim 1, wherein the at least one transparent substrate comprises at least one second polyester resin.

3. The transparent conductive film according to claim 1, wherein the at least one transparent substrate comprises polyethylene terephthalate or a copolyester comprising ethylene terephthalate repeat units.

4. The transparent conductive film according to claim 1, wherein the at least one metal nanowire comprises at least one coinage metal or at least one element from IUPAC Group 11 or silver.

5. The transparent conductive film according to claim 1, wherein the at least one first cellulose ester polymer or the at least one second cellulose ester polymer comprises cellulose acetate butyrate.

6. The transparent conductive film according to claim 1, wherein the at least one radiation curable monomer comprises an average functionality of four or larger.

7. The transparent conductive film according to claim 1, wherein the at least one hardcoat layer has a pencil hardness of least about 6H.

8. The transparent conductive film according to claim 1, wherein the at least one hardcoat layer has an adhesion value of 5.0.

9. The transparent conductive film according to claim 1, wherein the total of the haze values of the at least one transparent substrate, the at least one carrier layer, and the at least one hardcoat layer is less than about 0.60 percent.

* * * * *